(12) United States Patent
Lei et al.

(10) Patent No.: US 7,057,133 B2
(45) Date of Patent: Jun. 6, 2006

(54) METHODS OF DRILLING THROUGH-HOLES IN HOMOGENOUS AND NON-HOMOGENOUS SUBSTRATES

(75) Inventors: Weisheng Lei, Beaverton, OR (US); John J. Davignon, Hillsboro, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 0 days.

(21) Appl. No.: 10/825,039

(22) Filed: Apr. 14, 2004

(65) Prior Publication Data

US 2005/0230365 A1    Oct. 20, 2005

(51) Int. Cl.
B23K 26/38    (2006.01)
(52) U.S. Cl. .................................. 219/121.71
(58) Field of Classification Search ............. 219/121.7, 219/121.71
See application file for complete search history.

(56) References Cited

U.S. PATENT DOCUMENTS

| | | | | |
|---|---|---|---|---|
| 5,093,548 A * | 3/1992 | Schmidt-Hebbel | ..... | 219/121.71 |
| 5,610,707 A | 3/1997 | Duncan et al. | ............. | 356/121 |
| 5,841,099 A | 11/1998 | Owen et al. | .......... | 219/121.69 |
| 5,841,102 A * | 11/1998 | Noddin | .................. | 219/121.71 |
| 5,910,255 A * | 6/1999 | Noddin | ........................ | 216/18 |
| 6,025,256 A | 2/2000 | Swenson et al. | ............ | 438/601 |
| 6,103,992 A * | 8/2000 | Noddin | .................. | 219/121.71 |
| 6,433,301 B1 * | 8/2002 | Dunsky et al. | ........ | 219/121.67 |
| 6,676,878 B1 | 1/2004 | O'Brien et al. | ............. | 264/400 |
| 6,706,998 B1 | 3/2004 | Cutler | .................... | 219/121.72 |
| 6,809,289 B1 * | 10/2004 | Yung et al. | ............ | 219/121.71 |
| 2002/0033558 A1 | 3/2002 | Fahey et al. | ................. | 264/400 |
| 2002/0104831 A1 * | 8/2002 | Chang et al. | ............ | 219/121.7 |
| 2002/0125227 A1 | 9/2002 | Sun et al. | ............... | 219/121.61 |
| 2002/0185474 A1 | 12/2002 | Dunsky et al. | .......... | 219/121.7 |

FOREIGN PATENT DOCUMENTS

| | | | |
|---|---|---|---|
| DE | 4034745 | | 7/1991 |
| EP | 544398 A1 | * | 6/1993 |
| JP | 10-314972 A | * | 12/1998 |
| WO | WO-86/02301 A1 | * | 4/1986 |

OTHER PUBLICATIONS

Abeln et al., "High Precision Machining with Solid State Lasers", May 2000, LAMBDA Highlights, a publication of LAMBDA Physik, pp. 5-7.*
What's PLD?, available at http://ap.polyu.edu.hk/pld/PLD.html, dated May 5, 2003, 4 pgs.
Pulsed Laser Deposition and Plasma Investigations, Dr. Geoff Martin, On the Pulse, Dec./ 00-Feb. 00, vol. 1, issue 4, 4 pgs., available at http://www.andor-tech.com/pulse/otpdec99.pdf.

* cited by examiner

*Primary Examiner*—Geoffrey S. Evans
(74) *Attorney, Agent, or Firm*—Stoel Rives LLP

(57) ABSTRACT

A differential diameter hole drilling method by which through-holes having improved major surface quality are formed in a target material involves drilling a pilot hole having a diameter that is less than the desired diameter of the through-hole and then drilling a through-hole having the desired diameter. The pilot hole forms a channel from which thermal energy produced during laser drilling can diffuse into the environment, thereby reducing the amount of thermal energy diffusing into the surrounding target material matrix and the degree of thermal damage to the heat affected zone of the target material matrix. The pilot hole also forms a channel through which ablated target material may be removed, thereby increasing overall through-hole throughput. Pilot hole formation reduces the thermal energy required to form the remaining portion of the through-hole and thereby results in less thermal damage to the surrounding target material matrix.

14 Claims, 5 Drawing Sheets

METHODS OF DRILLING THROUGH-HOLES IN HOMOGENOUS AND NON-HOMOGENOUS SUBSTRATES

TECHNICAL FIELD

The invention relates to laser micromachining and, in particular, to the use of high-power lasers to effect removal of substrate material and thermal energy added during through-hole formation.

BACKGROUND OF THE INVENTION

Through-hole drilling is a basic process carried out in the microelectronics manufacturing industry. Exemplary target materials in which through-holes are typically drilled include multi-chip modules (MCMs), ball grid arrays, pin grid arrays, circuit boards, glass cloths (including FR4), hybrid microcircuits, and semiconductor microcircuits. These target materials typically include separate component layers of metal, organic dielectric, and/or reinforcement materials. Through-holes are typically drilled mechanically; however, the growing need for small diameter (e.g., less than 150 microns) through-holes has made mechanical drilling of them impracticable. As the need for small-diameter through-holes increases, there is a consequent increased need for high aspect ratio through-holes (through-holes for which the hole diameter to hole depth ratio is equal to or less than 1.0). High-power laser drilling has been used almost exclusively to form these through-holes.

Exemplary high-power lasers that are used to drill through-holes include ultraviolet (UV) lasers, carbon dioxide ($CO_2$) lasers, and excimer lasers. Drilling involves directing the laser to impinge the target material at a desired spot and ablating the entire thickness of the target material to form a through-hole at the desired spot. During drilling, ablated material is removed through the top opening of the hole. Once the through-hole is completely formed, the remaining ablated material may also be removed through the bottom opening of the through-hole. Although laser drilling facilitates the formation of small-diameter through-holes, through-hole laser drilling remains an imperfect method plagued by various problems.

One problem with laser-drilling through-holes in nonhomogeneous substrates is that they typically exhibit poor wall quality. As the high-power laser drills deeper into the target material, more of the thermal energy added remains in the hole than can escape through the top opening, resulting in a significant amount of thermal energy diffusing through the hole wall into the target material matrix. This diffusion causes significant structural damage to the target material located within the heat affected zone. Further, the inability to efficiently remove drilled target material through the top opening of the through-hole results in the formation of through-holes having undesirable fiber protrusions and/or resin etchback.

A second problem with laser-drilling through-holes is the formation of grooves on the through-hole walls, which result from interaction between the laser beam and the target material. For example, use of a $CO_2$ laser to drill ferrous materials results in the following cyclical process: an exothermic reaction occurs in the spot area, causing rapid expansion of the molten material; once the reaction front leaves the spot area, the molten material resolidifies. This entire cycle is repeated at various depths, creating a periodic grooved structure depthwise along the cut surface.

A third problem with laser-drilling through-holes is that a portion of the drilled target material can partly block subsequent laser pulses or form a plasma plume. For example, target material debris remaining in the hole during laser drilling often ignites and etches out into the heat affected zone. Because a gas plume typically ignites within 10 nanoseconds of the start of each laser pulse, approximately 80% of each laser pulse includes a plasma plume. This occurrence typically results in undesirable resin etchback.

Additionally, superheated debris can change the nature of the ablation process from predominantly ablative to less ablative and more thermal, thereby creating a saturation depth that unfavorably imposes a practical limit on the power density and repetition rate of the high-power laser. Limiting the power density and repetition rate limits the extent to which the ablation rate can be increased.

A fourth problem with laser-drilling through-holes occurs when forming through-holes in highly heterogeneous materials, such as FR4 cloths, which are organic polymer resin-impregnated glass cloths sandwiched between electrically and thermally conductive metal layers. Because the laser ablation characteristics, such as melting and vaporization temperatures, differ for each individual layer, laser processing through-holes is very difficult. For example, the vaporization temperatures of woven glass reinforcement and polymer resin matrix differ greatly. Silicon dioxide (a commonly used woven glass reinforcement) has a melting temperature of about 1,970 Kelvin (K) and a vaporization temperature of about 2,503K. In contrast, organic resins (i.e., epoxies) vaporize between about 500K and about 700K. The disparity in vaporization temperatures makes it difficult to laser-ablate the glass component without ablating the resin surrounding individual glass fibers or in regions directly adjacent to fiber bundles.

Thus far the primary industrial solution to minimizing the detrimental effects consequent to forming through-holes with high-power lasers is to optimize the cutting parameters and, in particular, to use defined laser pulses. However, the degree of improvement that can be made using this method is relatively minimal because optimization of one parameter is often detrimental to a separate aspect of through-hole formation.

Although high-power laser drilling is an integral part of semiconductor micromachining technology, no economically efficient laser drilling method has been found to drill through-holes having smooth walls with a reduced incidence of cut-surface groove formation, fiber protrusion, or fiber etchback. This invention addresses the desire to use a high-power laser to drill through-holes having smooth walls.

SUMMARY OF THE INVENTION

An object of the present invention is, therefore, to provide ah efficient and economical method of forming a through-hole in a non-homogeneous substrate using a high-power laser to effect controlled target material and thermal energy removal. The resulting through-hole exhibits a smooth wall and minimal thermal damage. The overall result is a method of performing laser operations that offers improved performance in terms of processing quality, reproducibility of the technological result, ability to drill high aspect ratio through-holes, and effectiveness at low additional cost.

The present invention is a differential diameter hole drilling method by which through-holes having improved hole wall quality may be formed in a target material. The method involves drilling a pilot hole having a diameter that is less than the desired through-hole diameter and then drilling a through-hole having the desired diameter.

The pilot hole forms a channel through which thermal energy produced during laser drilling may diffuse into the environment, thereby reducing the amount of thermal energy diffusing into the surrounding target material matrix and the degree of thermal damage to the heat affected zone of the target material matrix. Careful selection of the pilot hole diameter and the drilling parameters provides significant reduction in the amount of thermal damage to the heat affected zone surrounding the through-hole during its formation and enhances the wall quality of the drilled through-hole.

The pilot hole also forms a channel through which drilled target material may be removed, thereby increasing overall through-hole throughput. Because a portion of the total target material that must be removed as part of the through-hole formation process is ablated and removed during formation of the pilot hole, the thermal energy required to remove the remaining portion of target material is reduced. When less thermal energy is needed to form the remaining portion of the through-hole, less thermal damage to the surrounding target material matrix results.

In a first preferred embodiment of the present invention, the laser output of a high-power laser thermally ablates a portion of a target material to form a pilot hole. The pilot hole may be drilled such that it extends completely through the thickness of the target material or such that it extends only partly through the thickness of the target material to form a blind via that does not penetrate all layers and/or materials. Further, the pilot hole and the through-hole may be formed on the same major surface of the target material or on opposite major surfaces of the target material.

A second preferred embodiment of the present invention is a three-step method of forming a through-hole having a desired diameter. The first step of the three-step method involves directing a first laser output for incidence on the target material to form a portion of the through-hole in the form of a blind via having the same diameter as that of the desired through-hole. The portion of the through-hole may be formed on either major surface of the target material. In the second step, a second laser output is directed for incidence on the target material to form a pilot hole having a diameter smaller than either that of the through-hole portion or the final through-hole. The bottom of the pilot hole preferably forms a portion of the bottom of the previously formed through-hole portion. The pilot hole may be formed on either major surface of the-target material. In the third step, a third laser output is directed for incidence on the target material to complete formation of the through-hole having the desired diameter. The third laser output may be directed at either major surface of the target material. The first and second laser outputs are directed so that the through-hole portion and the completed through-hole are axially aligned, and, when the desired through-hole has a small diameter (less than 150 microns), the second laser output preferably impinges on the target material to form a pilot hole that is coaxial with the through-hole portion.

The method of the present invention facilitates the formation of high-aspect ratio through-holes because the depth of the through-hole can be increased without incurring increased through-hole wall thermal damage. Additionally, the method enables an increase in the material removal rate and thereby reduces manufacturing costs and increases overall via-per-second throughput. The method of the present invention also avoids or minimizes the undesirable formation of grooved structures on the side walls of the through-holes, slag deposits adhering to the bottom edge of the cut, and thermal damage to the surrounding target material matrix. Thus the method of the present invention promotes through-hole quality and throughput.

Additional aspects and advantages of this invention will be apparent from the following detailed description of preferred embodiments, which proceeds with reference to the accompanying drawings.

DETAILED DESCRIPTION OF PREFERRED EMBODIMENTS

The present invention is an efficient method of using high-power lasers to effect the controlled removal of target material to form through-holes in a target material. Specifically, the method involves drilling a pilot hole having a diameter that is less than the desired diameter of the through-hole and thereafter drilling the through-hole. With careful selection of the drilling parameters, including the diameter of the pilot hole, pilot hole formation reduces the degree and amount of thermal damage to the heat affected zone surrounding the hole, thereby significantly improving the hole wall surface quality of the drilled through-hole.

Figure 1B:
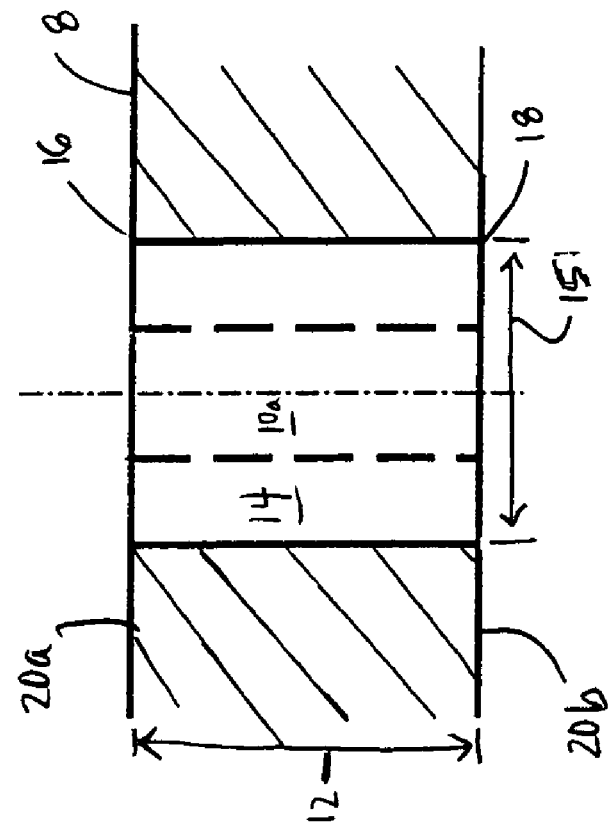
FIGS. 1a and 1b and FIGS. 2a and 2b are fragmentary cross-sectional views of a target material in different stages of through-hole formation in accordance with a first embodiment of the invention carried out by initially drilling a pilot hole completely or partly, respectively, through the thickness of the target material.
Figure 1A:
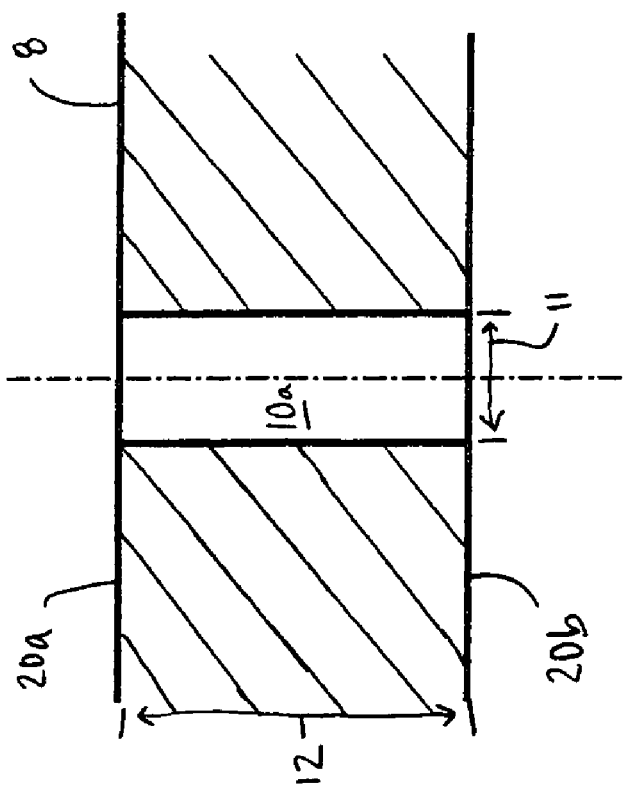

With reference to FIGS. 1a and 1b, in a first preferred embodiment of the present invention, a laser output beam 2 emitted by a high-power laser 4 is directed at a location on a target material 8. For discussion purposes, target material 8 is shown in FIGS. 1a, 1b, 2a, 2b, 3a, and 3b as a homogeneous material, but the invention is also applicable to non-homogenous or layered materials. Laser beam 2 ablates a portion of target material 8 to form a pilot hole 10 having a diameter 11. As shown in the cross-sectional side views of FIGS. 1a and 2a, pilot hole 10 may be drilled such that it extends completely through the thickness 12 of target material 8 (as denoted by pilot hole 10a in FIG. 1a) or such that it extends-only partly through thickness 12 of target material 8 (as denoted by pilot hole 10b in FIG. 2a) to form a blind via that does not penetrate all layers and/or materials. Proper selection of the laser parameters permits certain layers of target material 8 to remain unaffected even if they include the same component(s) as ablated layers.

Figure 2B:
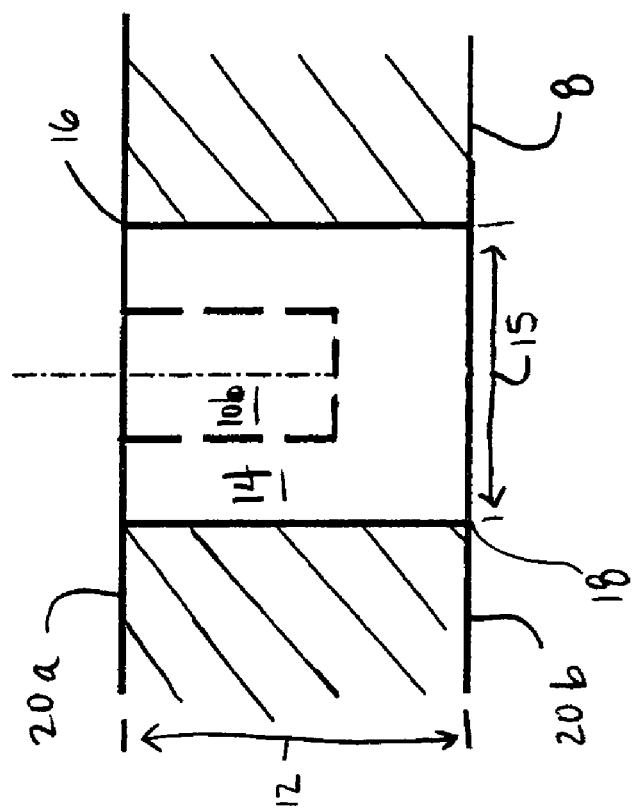
Figure 2A:
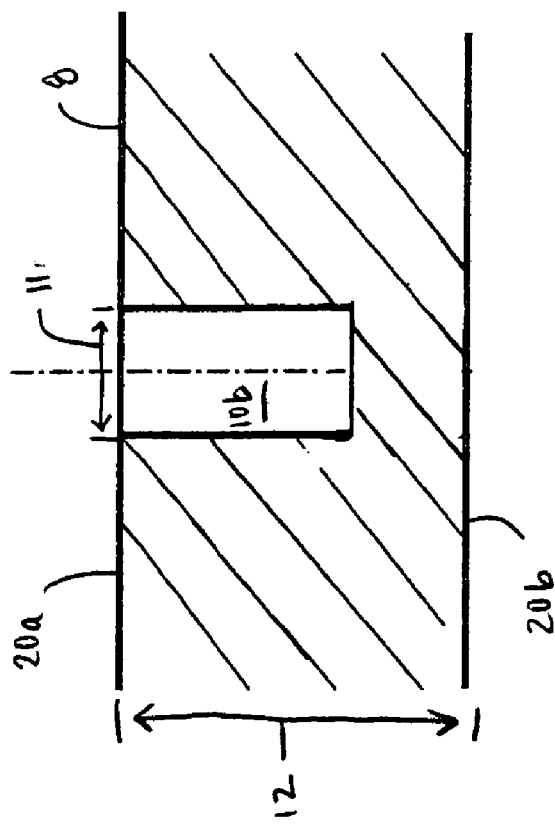

After the formation of pilot hole 10, a second laser output is directed at the location on target material 8 to form a through-hole 14 having a diameter 15 that is greater than diameter 11. Through-hole 14 extends through thickness 12 of target material 8. Through-hole 14 may be formed by the same high-power laser that formed pilot hole 10 or by a different laser. Through-hole 14 cleanly and evenly penetrates all layers and materials of target material 8 and exhibits negligible taper from its top end 16 to its bottom end 18. As shown in FIGS. 1a and 1b, pilot hole 10a is formed such that ablated target material may be removed from either top end 16 or bottom end 18 of pilot hole 10a before the formation of through-hole 14. As shown in FIGS. 2a and 2b, pilot hole 10b is formed such that ablated target material may be removed through top end 16 of pilot hole 10b before the formation of through-hole 14. For future reference, holes drilled only partly through thickness 12 of target material 8 are referred to as blind vias.

Pilot hole 10 and through-hole 14 may be initially drilled on the same major surface 20 or different major surfaces 20 of target material 8. For example, formation of pilot hole 10 may be started on first major surface 20a of target material 8. Formation of through-hole 14, which has a greater diameter than that of pilot hole 10, can then be started on first major surface 20a of target material 8. Alternatively, formation of pilot hole 10 can be started on first major surface 20a of target material 8. Formation of through-hole 14, which has a greater diameter than that of pilot hole 10, can then be started on second major surface 20b of target material 8. As mentioned above, pilot hole 10 can be either a through-hole or a blind via.

Figure 3B:
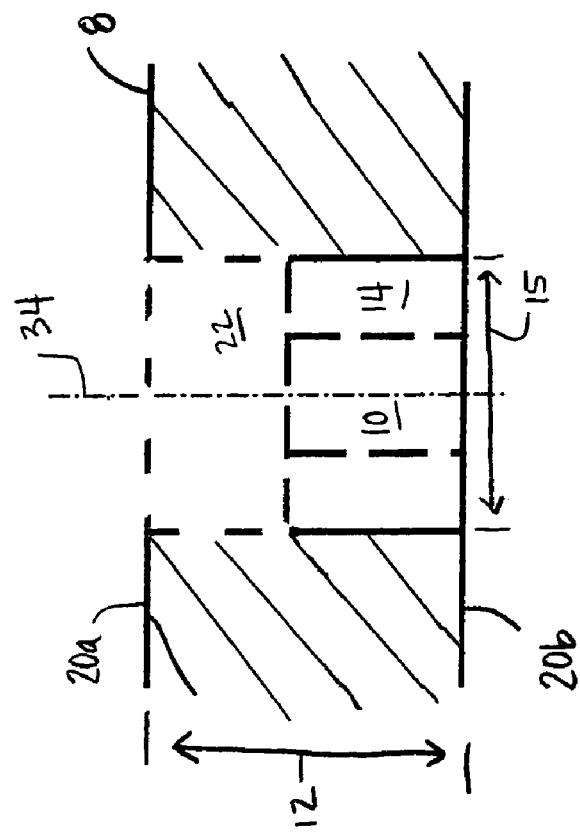
FIGS. 3a and 3b are fragmentary cross-sectional views of a target material in different stages of through-hole formation in accordance with a second embodiment of the invention carried out in accordance with a three-step process including initially drilling a blind via of a desired diameter, drilling a pilot hole of lesser diameter, and drilling to complete formation of a through-hole of the desired diameter.
Figure 3A:
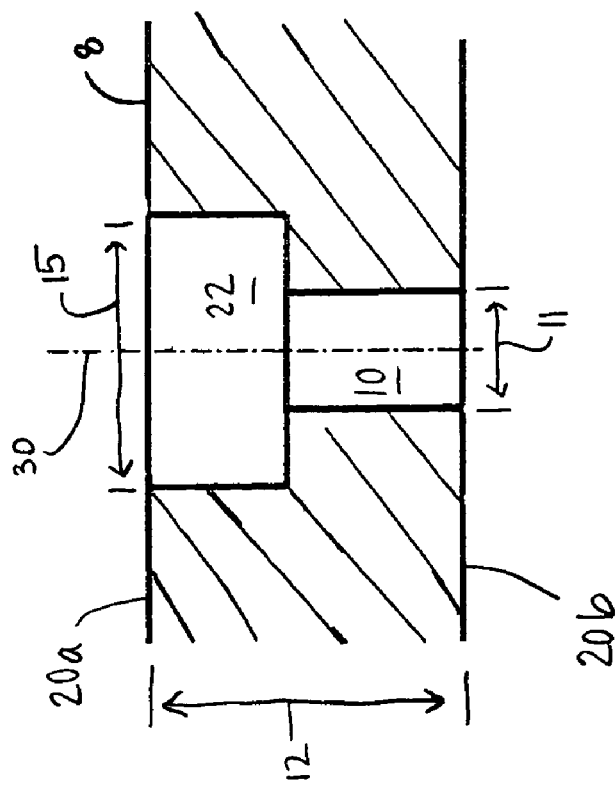

With reference to FIGS. 3a and 3b, a second preferred embodiment of the present invention is a three-step method of forming a through-hole having the desired diameter. The first step of the three-step method involves initially forming on first major surface 20a of target material 8 a depthwise portion 22 of through-hole 14 in the form of a blind via having an axis 30 and the same diameter as that of the desired through-hole. In the second step, pilot hole 10 having a diameter 11 smaller than that of through-hole portion 22 and extending only partly through thickness 12 of target material 8 is initially formed on second major surface 20b of target material 8 such that pilot hole 10 extends through a portion of the bottom of the previously formed through-hole portion 22. Completion of the second step results in formation of a hole of diameter 11 in the bottom of through-hole portion 22. In the third step, through-hole 14 having the desired diameter is formed by initially drilling through second major surface 20b of target material 8. The through-hole has an axis 34 that is preferably coaxially aligned with axis 30 to facilitate uniform heat distribution. This process is typically preferred when the desired through-hole has a diameter of less than 30 microns.

Skilled persons will recognize that fiducial marks (alignment targets) may be placed on the target material to facilitate alignment of the laser output and the target material when different target material major surfaces are used to drill the through-hole portion, pilot hole, and/or through-hole. The laser optically locates the fiducial marks and aligns the laser output with one of them using pattern recognition technology commonly known to those skilled in the art.

Skilled persons will further recognize that many variations of the second preferred embodiment may be implemented. For example, both portion 22 of through-hole 14 and pilot hole 10 may be penetrate first major surface 20a of target material 8 and through-hole 14 may penetrate second major surface 20b of target material 8. Alternatively, portion 22 of through-hole 14 may penetrate first major surface 20a of target material 8, pilot hole 10 may penetrate second major surface 20b of target material 8, and through-hole 14 may penetrate first major surface 20a of target material 8. Skilled persons will also recognize that pilot hole 10 of the second preferred embodiment of the present invention may be a blind via.

Ablated target material may be removed during pilot hole formation or during subsequent processing. The substrate protection and smaller critical dimensions afforded by the method of the present invention are significant improvements over conventional through-hole processing methods. Through-holes can be, for example, spaced apart by about 2 microns from other through-holes or adjacent circuit structures. Moreover, a portion of the total target material that would have been removed as part of the process of forming the through-hole is removed during formation of the pilot hole. Pilot hole formation reduces, therefore, the thermal energy required to remove the remaining portion of target material and results in reduced thermal damage to the surrounding target material matrix.

The selection of the pilot hole configuration is based on the specific target material and the desired through-hole aspect ratio. Skilled persons will appreciate that the first and second laser outputs may be repeated to produce stepped, tapered, or vertically edged vias through multiple sets of layers.

Use of the method of the present invention to effect through-hole drilling on a target material may be performed in various ways. In one preferred implementation, a laser is used to drill all of the pilot holes in the target material. Next, the same laser, operated with different operational parameters, or a different laser is used to drill all of the through-holes in the target material. In an alternative implementation, each individual pilot hole and through-hole is formed before the next pilot hole and through-hole is formed. This implementation may be effected by using two separate lasers that travel along the same pathway or using a dual-head laser.

Via diameters preferably range from between about 25 microns to about 300 microns, but high-power laser 4 may produce vias having diameters of between about 5 microns and about 1 mm. Because the preferred spot size of output beam 2 is between about 5 microns and 75 microns in diameter, vias larger than 25 microns are typically produced by trepanning, concentric circle processing, or spiral processing in which the first and second laser beams are sequentially directed at target material 8 in overlapping contiguous locations along a spiral tool path to a periphery. The first and second laser outputs are preferably moved continuously through each location at a speed sufficient for the laser outputs to deliver a number of beam pulses necessary to achieve the desired depth of cut.

Figure 4:
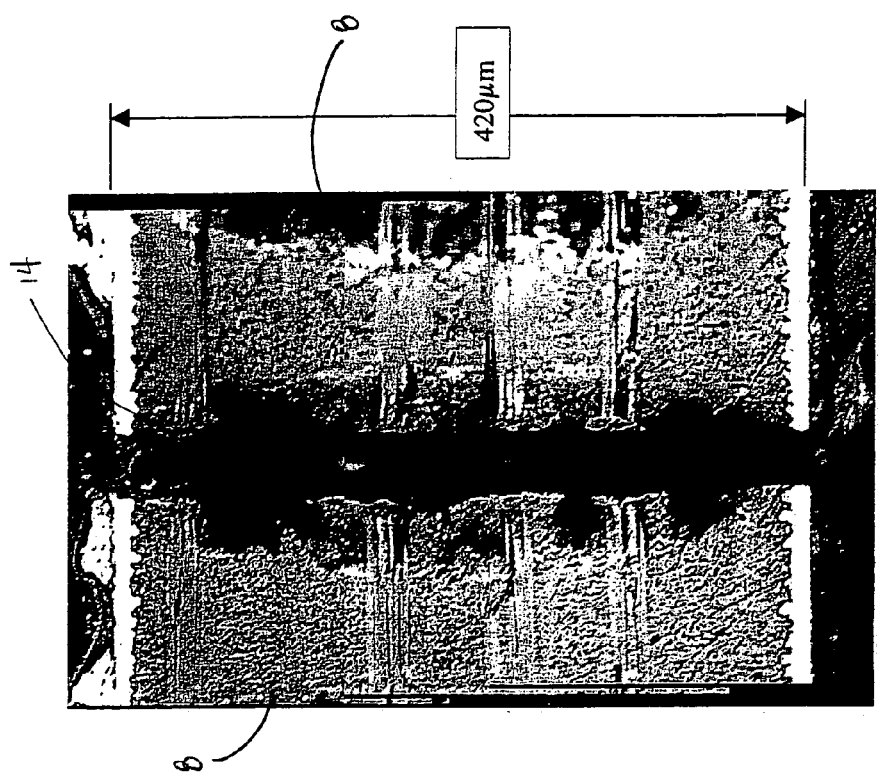
FIGS. 4 and 5 are scanning electron micrographs (SEMs) taken at equivalent magnifications and presenting a comparative relationship of cross-sectional views of wall surfaces of through-holes formed in multi-layer electronic circuit boards in accordance with methods of, respectively, the prior art and the present invention.
Figure 5:
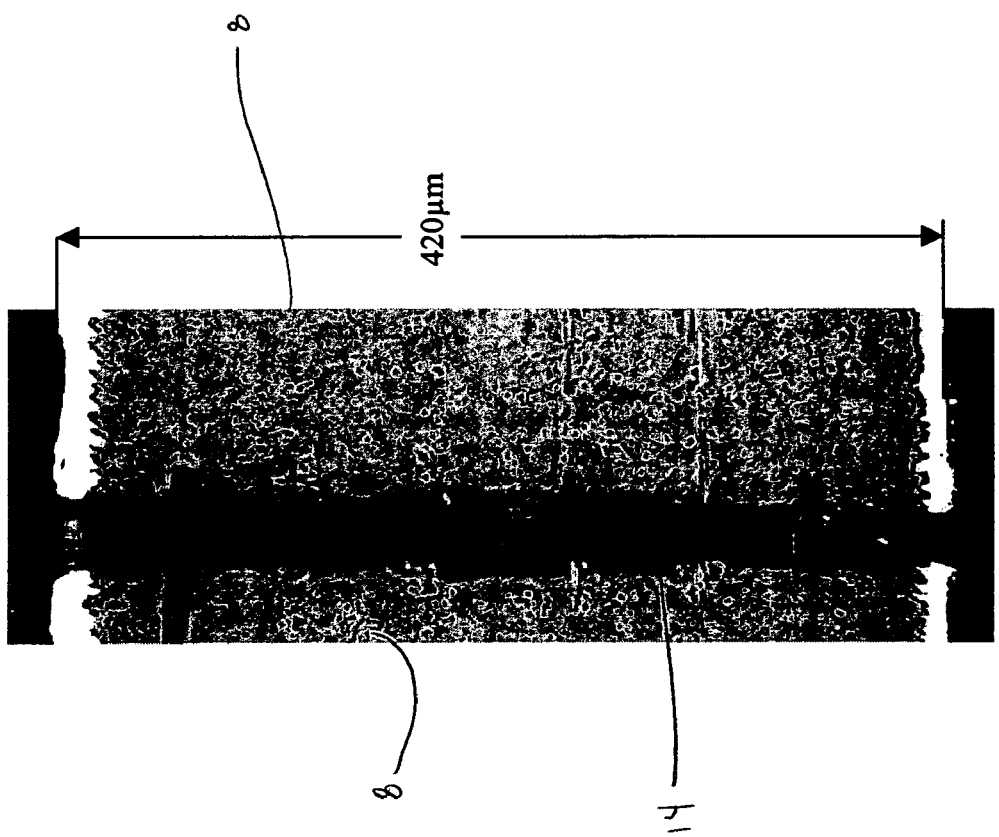

FIGS. 4 and 5 are SEMs taken at equivalent magnifications and showing cross-sectional views of the wall surfaces of the through-holes formed in a multi-layered circuit board in accordance with methods of, respectively, the prior art and the present invention. More specifically, FIGS. 4 and 5 show a cross-sectional view of a 60-micron-diameter through-hole drilled using a one-step trepan on a two-layer copper-coated FR4 panel 50 having a thickness of 420 microns. Panel 50 includes alternating layers of glass cloth 52 and glass fiber resin 54 bounded by two opposing layers of copper 56. Comparison of the SEMs of FIGS. 4 and 5 clearly shows the improved wall surface quality consequent to practice of the method of the present invention. Specifically, the through-hole of FIG. 4 exhibits poor wall quality because a significant amount of resin recession of the glass cloth has occurred. Resin recession occurs when thermal energy added to the through-hole diffuses through the hole wall into the resin surrounding the glass cloth, causing significant structural damage to resin surrounding the glass cloth in the heat affected zone surrounding the through-hole. In contrast, the through-hole of FIG. 5 exhibits excellent wall quality and minimal resin recession.

Because the glass transition temperatures differ for varying glass-based materials used in multi-layered circuit boards, a depthwise differential power profile which varies for each multi-layered circuit board being drilled may be used in connection with all of the embodiments of the present invention. The preferred depthwise differential power profile is empirically determined for each target material. For example, glass cloth melts at approximately 1700° C. while resin melts at approximately 280° C. Thus, during drilling, when the target material changes from glass cloth to resin, there is a tremendous amount of excess energy being placed in the through-hole. As mentioned above, this can cause various undesirable effects, including resin recession and the formation of a plasma plume, both of which result in poor wall quality of the finished through-hole. The formation of a pilot hole in the target material allows a significant part of the excess thermal energy to escape when the laser is drilling through the resin layer, which melts at a much lower temperature. Thus the method of the present invention significantly improves the wall quality of the resulting through-hole.

The present invention is useful for performing laser operations on a wide variety of target materials, including homogenous and non-homogenous materials including various metals and brittle materials such as glass, silicon, and ceramics, MCMs, ball grid arrays, pin grid arrays, circuit boards, and hybrid and semiconductor microcircuits. A preferred target material is a multi-layered fiberglass reinforced printed circuit board. Printed circuit boards typically include separate component layers of metal, dielectric, and/ or reinforcement materials.

Exemplary metal component layers include aluminum, copper, gold, molybdenum, nickel, palladium, platinum, silver, titanium, tungsten, or combinations thereof. Although these layers may have any appropriate thickness, their thickness is typically between about 9 microns and about 36 microns.

Exemplary organic dielectric layers include bismaleimide triazine (BT), cardboard, cyanate esters, epoxies, phenolics, polyimides, or polytetrafluorethylene (PTFE). Although these layers may have any appropriate thickness, they typically have a thickness that is between about 50 microns and about 400 microns, which is greater than the thickness of the metal component layers.

Exemplary reinforcement component layers include fiber mats, dispersed particles of aramid fibers, ceramics, or glass (either woven or dispersed into the organic dielectric layer). Although these layers may have any appropriate thickness, their thickness is typically between about 1 micron and about 150 microns, which is less than the thickness of the organic dielectric layers. Skilled persons will appreciate that reinforcement component layers may be introduced into the organic dielectric layers as a powder. The consequent powdery layers may be noncontiguous and nonuniform. Skilled persons will also appreciate that the metal component, organic dielectric, and reinforcement component layers may be internally noncontiguous, nonuniform, and nonlevel.

Unfired, "green" ceramic substrates formed by high-pressure pressing of micron- or submicron-scale powders of common ceramics such as aluminum oxide ($Al_2O_3$) or aluminum nitride (AlN) are another preferred target material. The powder particles are held together with organic "binders" that provide sufficient mechanical integrity to permit machining operations, such as via drilling, to be performed. Following drilling, the green material is fired at a high temperature, which drives off the binders and fuses or sinters the powder particles into an extremely strong and durable substrate.

Although any high-power laser may be used in connection with the method of the present invention, exemplary preferred lasers include ultraviolet (UV) lasers, including solid-state laser and excimer lasers, and $CO_2$ lasers. Skilled persons will appreciate that the laser pulses can be developed by pulsed Q-switched lasers operating in accordance with conventional techniques or by continuous-wave lasers cooperating with a shutter periodically opening to provide continuous-wave emission for specified times and to thereby form laser pulses. Top layer ablation provides more choices for laser sources that can be selected based on other criteria such as wavelength, spot size, and availability. The parameters of each laser's output pulses are selected to facilitate substantially clean drilling and via formation in the above-mentioned target materials. Because the preferred drilling parameters relating to each type of laser vary, each type of laser is discussed in greater detail below.

One preferred laser for use in connection with the method of the present invention is a UV, Q-switched, solid-state laser that preferably includes a solid-state lasant such as Nd:YAG, Nd:YLF, Nd:YAP, Nd:YVO$_4$, Yb:YAG, Ti:Sapphire, or a YAG crystal doped with holmium or erbium. One advantage of using UV is that the focal length tolerance facilitates the machining of nonuniformly thick targets. Preferred wavelengths include, but are not limited to, 532 nm (frequency doubled Nd:YAG), 355 nm (frequency tripled Nd:YAG), and 266 nm (frequency quadrupled Nd:YAG) with primarily a TEM$_{00}$ spatial mode profile. An additional preferred wavelength is 152 nm, and skilled persons will appreciate that lasers emitting at other suitable wavelengths may also be used in connection with the method of the present invention. An exemplary commercially available laser is the Model 210 UV-3500 laser sold by Lightwave Electronics of Mountain View, Calif. The laser preferably provides imaged, shaped output at a bite size of between about 1 micron and about 7 microns.

Exemplary parameters of the UV, Q-switched, solid-state laser output include average energy densities greater than about 5 microjoules ($\mu J$) measured over the beam spot area, more preferably greater than 30 $\mu J$; spot size diameters or spatial major axes of less than about 100 microns, and preferably between about 1 microns to about 50 microns; a repetition rate of greater than about 1 kiloHertz (kHz), and preferably greater than about 20 kHz; and average intensities or irradiances of greater than 100 milliwatts (mW) over the spot areas. The preferred parameters are selected in an attempt to circumvent thermal damage effects by utilizing temporal pulse widths that are shorter than about 300 nanoseconds (ns), and preferably from about 0.1 picosecond (ps) to 150 ns, and more preferably between about 1 ns and about 100 ns. The power requirements for laser processing of the target material at particular wavelengths are scaled in proportion to the spot size used. Skilled persons will appreciate that these parameters will vary and can be optimized for the material to be processed, and that different parameters may be used to process different target layers.

The laser system output beam preferably produces a spot area having a diameter of less than about 25 microns.

Although the spot area and diameter generally refer to $1/e^2$ dimensions, these terms are occasionally used to refer to the spot area or diameter of the hole created by a single pulse. Skilled persons will also appreciate that the spot area of the output beam is preferably generally circular. However, noncircular vias may also be ablated through similar processes. Such vias may, for example, have square, rectangular, oval, slot-like, or other major surface geometries. Skilled persons will also appreciate that the output beam can be imaged or clipped of its wings or tails, particularly for first step processing, if desired for specific operations.

The following Table 1 provides process parameters and overall throughput data for drilling the through-holes using the second preferred method of the present invention using a UV, Q-switched, solid-state laser. The pilot holes were drilled in the fifth and sixth steps of the table and were drilled through the entire thickness of the target material. The through-hole was drilled in steps 7 and 8.

TABLE 1

Process Parameters and Overall Throughput Data.

| Array # | Step # | Pulses | Bite Size (microns) | Velocity (mm/s) | Rep rate (kHz) | Reps | FP | Settle time (ms) | Max hit rate (vias/s) | Eff. spot size (microns) | Tool diam. (microns) | Drill type (T, S, P) | Offset from focus (mm) | Avg power (W) | Avg hit rate (vias/s) |
|---|---|---|---|---|---|---|---|---|---|---|---|---|---|---|---|
| 4 | 1 |  | 5.56 | 166.7 | 30 | 60 | Y | 0 | 27.1 | 28 | 60 | T | −0.2 | 5.7 | 27.1 |
| 30 | 1 |  | 8.2 | 246 | 30 | 4 | Y | 0 | 303 | 13 | 60 | T | −0.1 | 1.8 |  |
|  | 2 |  | 7.33 | 219.9 | 30 | 4 | N | 0 | 303 | 18 | 60 | T | −0.2 | 1.8 |  |
|  | 3 |  | 6.63 | 167.5 | 30 | 4 | N | 0 | 303 | 28 | 60 | T | −0.4 | 1.8 |  |
|  | 4 |  | 4.36 | 130.8 | 30 | 4 | N | 0 | 303 | 35 | 60 | T | −0.5 | 1.8 |  |
|  | 5 | 30 |  |  |  |  | Y | 0 | 476 |  |  |  | −0.4 | 4.5 |  |
|  | 6 | 30 |  |  |  |  | Y | 0 | 476 |  |  |  | −0.5 | 4.5 |  |
|  | 7 |  | 6.63 | 167.5 | 30 | 4 | N | 0 | 303 | 28 | 60 | T | −0.4 | 1.8 |  |
|  | 8 |  | 4.36 | 130.8 | 30 | 4 | N | 0 | 303 | 35 | 60 | T | −0.5 | 1.8 |  |

$CO_2$ lasers can also be used in connection with the present invention. Common $CO_2$ microvia-drilling lasers include RF-excited lasers, transversely excited atmospheric (TEA) lasers, and fast-axial-flow lasers. However, because the wavelength of all $CO_2$ laser is between about 9 microns and about 11 microns, the laser output is highly reflected by metals, such as copper. Consequently, it is very difficult use $CO_2$ lasers to drill substrates that feature overlying metallic layers. Thus $CO_2$ lasers are preferably applied to layered substrates having either no overlying copper or an overlying copper layer in which via openings have been previosly etched by standard chemical means. Such "pre-etched" or "conformal mask" multilayered substrates may also have no woven reinforcements such as glass fibers in the dielectric layers. For example, a blind via can be formed in a target material composed of a layer of dielectric material covered on either major surface by a layer of metal. The formation of the blind via can be self-limiting such that via formation stops after the beam cuts through the dielectric material. The reason is that the beam pulse power density is insufficient to progress depthwise beyond the dielectric material to vaporize the remaining metal layer, even if beam pulses continue to strike the target. The depthwise self-limiting capability in blind via formation is advantageous because multilayered targets can present unpredictable, inconsistent target depths that result from warpage, nonuniform layer thickness, or nonuniform flatness of the mounting fixture.

It will be obvious to those having skill in the art that many changes may be made to the details of the above-described embodiments without departing from the underlying principles of the invention. The scope of the present invention should, therefore, be determined only by the following claims.

The invention claimed is:

1. A differential diameter hole drilling method by which a through-hole having improved wall surface uniformity and a predetermined diameter is formed in a target material including opposed first and second major surfaces and having a thickness, comprising:
   generating a first laser output having sufficient energy density over a first spatial spot size to remove target material within a first spot area;
   directing the first laser output to impinge the target material on the first major surface and thereby form a pilot hole having a pilot hole diameter that corresponds to the diameter of the first spot area and that is less than the predetermined diameter of the through-hole;
   generating a second laser output having sufficient energy density over a second spatial spot size to remove target material within a second spot area; and
   directing the second laser output to impinge the target material on the second major surface and thereby form a through-hole that extends through the thickness of the target material and that has a through-hole diameter corresponding to the diameter of the second spot area and to the predetermined diameter, the formation of the through-hole involving the addition of thermal energy that escapes through the pilot hole and thereby limits thermal distortion of the through-hole wall and enhances its surface uniformity.

2. The differential diameter hole drilling method of claim 1, in which the generating and directing the second laser output to impinge the target material includes forming a portion of the through-hole before forming the pilot hole, the portion of the through-hole having the predetermined diameter and extending only partly through the thickness of the target material, and in which the pilot hole extends partly through the thickness of the target material.

3. The differential diameter hole drilling method of claim 1, in which the pilot hole and the through-hole have, respectively, a pilot hole axis and a through-hole axis, and in which the directing the second laser output to impinge the target material includes spatially aligning the through-hole and pilot hole axes.

4. The differential diameter hole drilling method of claim 1, in which the pilot hole extends only partly through the thickness of the target material.

5. The differential diameter hole drilling method of claim 1, in which the pilot hole extends through the thickness of the target material.

6. The differential diameter hole drilling method of claim 1, in which the through-hole has a diameter of less than 150 microns.

7. The differential diameter hole drilling method of claim 1, in which the target material comprises a non-homogeneous material.

8. The differential diameter hole drilling method of claim 7, in which the target material comprises a multi-layered electronic circuit board.

9. The differential diameter hole drilling method of claim 8, in which the multi-layered electronic circuit board comprises a multi-layered fiberglass reinforced printed circuit board.

10. The differential diameter hole drilling method of claim 1, in which the first and second laser outputs are generated by one of a UV laser and a $CO_2$ laser.

11. The differential diameter hole drilling method of claim 10, in which the UV laser is an Nd:YAG emitting a laser beam having a wavelength of 355 nm.

12. The differential diameter hole drilling method of claim 1, in which the first and second laser outputs are generated by the same laser.

13. The differential diameter hole drilling method of claim 1, in which the first and second laser outputs are generated by respective first and second lasers.

14. The differential diameter hole drilling method of claim 1, in which the target material includes silicon.

* * * * *